(12) United States Patent
Gdor et al.

(10) Patent No.: US 11,409,205 B2
(45) Date of Patent: Aug. 9, 2022

(54) NON-ORTHOGONAL TARGET AND METHOD FOR USING THE SAME IN MEASURING MISREGISTRATION OF SEMICONDUCTOR DEVICES

(71) Applicant: KLA CORPORATION, Milpitas, CA (US)

(72) Inventors: Itay Gdor, Halevi (IL); Yuval Lubashevsky, Haifa (IL); Yuri Paskover, Binyamina (IL); Yoram Uziel, Migdal Ha'emek (IL); Nadav Gutman, Zichron Ya'aqov (IL)

(73) Assignee: KLA CORPORATION, Milpitas, CA (US)

( * ) Notice: Subject to any disclaimer, the term of this patent is extended or adjusted under 35 U.S.C. 154(b) by 28 days.

(21) Appl. No.: 16/964,734

(22) PCT Filed: Jun. 25, 2020

(86) PCT No.: PCT/US2020/039474
§ 371 (c)(1),
(2) Date: Jul. 24, 2020

(87) PCT Pub. No.: WO2021/158255
PCT Pub. Date: Aug. 12, 2021

(65) Prior Publication Data
US 2021/0364935 A1 Nov. 25, 2021

Related U.S. Application Data

(60) Provisional application No. 62/978,253, filed on Feb. 18, 2020, provisional application No. 62/971,800, filed on Feb. 7, 2020.

(51) Int. Cl.
*G03F 9/00* (2006.01)
*G03F 7/20* (2006.01)

(52) U.S. Cl.
CPC ............ *G03F 9/7003* (2013.01); *G03F 7/705* (2013.01); *G03F 7/70633* (2013.01); *G03F 9/7076* (2013.01)

(58) Field of Classification Search
CPC .... G03F 7/705; G03F 7/70633; G03F 9/7003; G03F 9/7076
See application file for complete search history.

(56) References Cited

U.S. PATENT DOCUMENTS

| 5,721,619 A | * | 2/1998 | Hiruma | G03F 7/70633 250/548 |
| 7,408,642 B1 | * | 8/2008 | DiBiase | G03F 7/70633 356/399 |

(Continued)

FOREIGN PATENT DOCUMENTS

| KR | 100715280 B1 | 5/2007 |
| WO | 2019139685 A1 | 7/2019 |

OTHER PUBLICATIONS

ISA/KR, ISR for PCT/US2020/039474, dated Nov. 3, 2020.
(Continued)

*Primary Examiner* — Deoram Persaud
(74) *Attorney, Agent, or Firm* — Hodgson Russ LLP

(57) ABSTRACT

A target for use in the measurement of misregistration between layers formed on a wafer in the manufacture of semiconductor devices, the target including a first pair of periodic structures (FPPS) and a second pair of periodic structures (SPPS), each of the FPPS and the SPPS including a first edge, a second edge, a plurality of first periodic structures formed in a first area as part of a first layer and having a first pitch along a first pitch axis, the first pitch axis not being parallel to either of the first edge or second edge, and a plurality of second periodic structures formed in a second area as part of a second layer and having the first (Continued)

pitch along a second pitch axis, the second pitch axis being generally parallel to the first pitch axis.

22 Claims, 10 Drawing Sheets

(56) References Cited

U.S. PATENT DOCUMENTS

| | | | |
|---|---|---|---|
| 7,608,468 B1 | 10/2009 | Ghinovker et al. | |
| 8,330,281 B2 | 12/2012 | Ghinovker et al. | |
| 9,476,698 B2 | 10/2016 | Abdulhalim et al. | |
| 2004/0137341 A1* | 7/2004 | Niu | G03F 7/70633 430/30 |
| 2005/0012928 A1* | 1/2005 | Sezginer | G01B 11/26 356/401 |
| 2010/0123886 A1 | 5/2010 | Bijnen et al. | |
| 2017/0357154 A1 | 12/2017 | Oh et al. | |
| 2019/0279841 A1* | 9/2019 | Xiao | G01B 15/00 |

OTHER PUBLICATIONS

ISA/KR, WO for PCT/US2020/039474, dated Nov. 3, 2020.
Adel et al., "Diffraction order control in overlay metrology: a review of the roadmap options," Proc. SPIE 6922, Metrology, Inspection, and Process Control for Microlithography XXII, 692202, Mar. 14, 2008. Mar. 14, 2008.

* cited by examiner

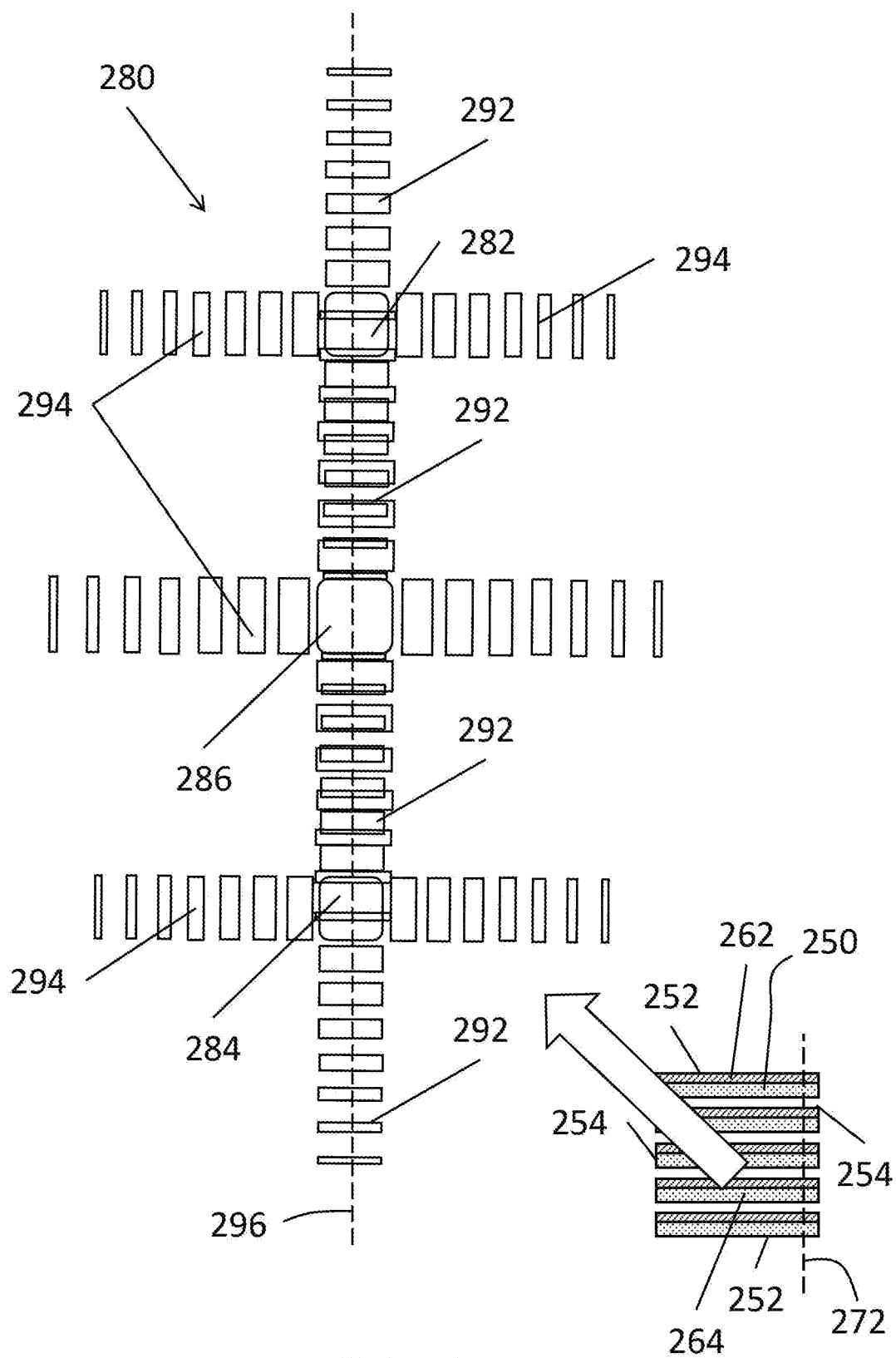
PRIOR ART  FIG. 2B

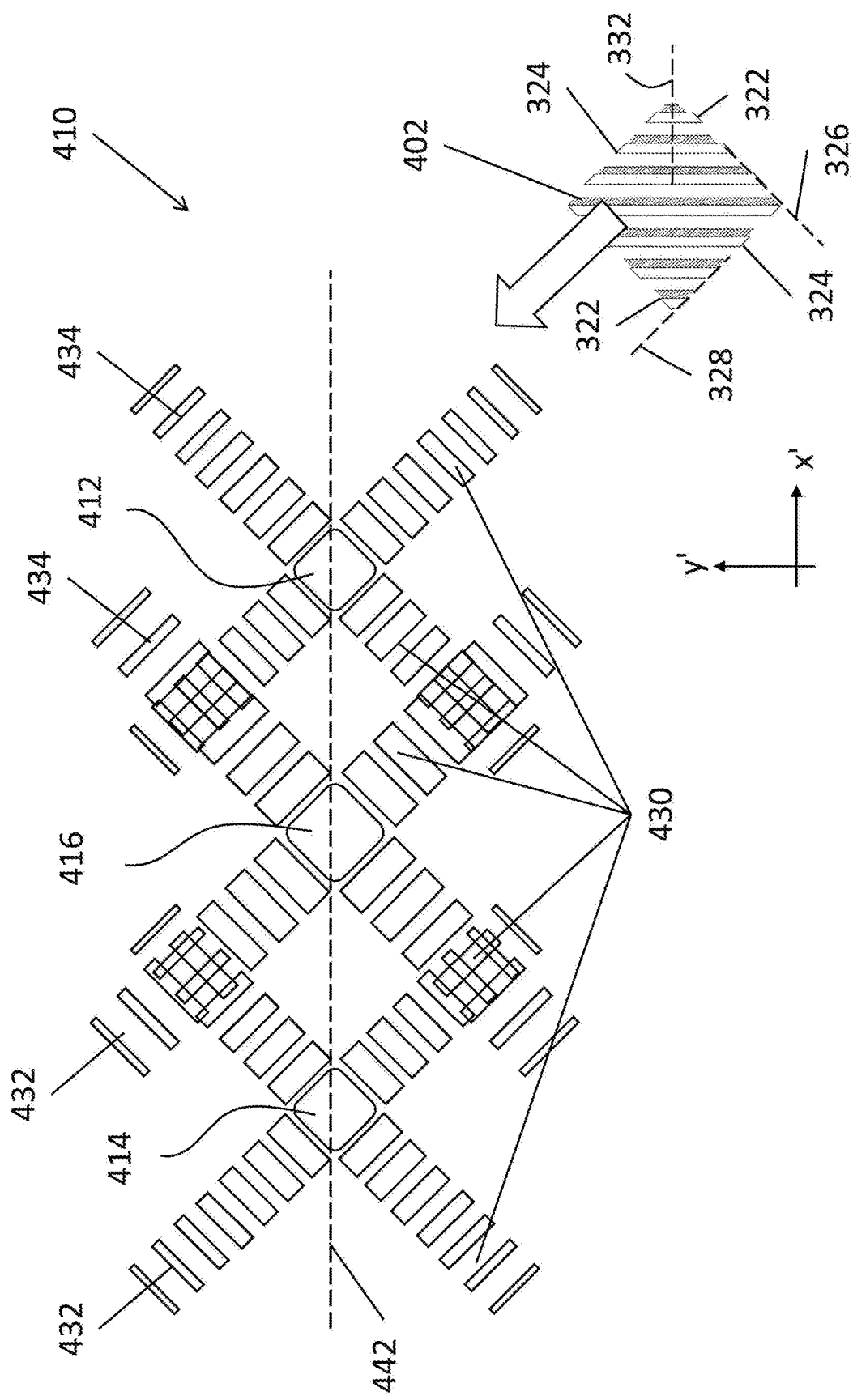

NON-ORTHOGONAL TARGET AND METHOD FOR USING THE SAME IN MEASURING MISREGISTRATION OF SEMICONDUCTOR DEVICES

REFERENCE TO RELATED APPLICATIONS

Reference is hereby made to U.S. Provisional Patent Application Ser. No. 62/971,800, filed Feb. 7, 2020 and entitled PYTHAGORAS OVL METROLOGY TARGET DESIGN FOR SMALL TARGETS AND INCORPORATION OF SEM TARGET WITH OPTICAL TARGET and to U.S. Provisional Patent Application Ser. No. 62/978,253, filed Feb. 18, 2020 and entitled PYTHAGORAS OVL METROLOGY TARGET DESIGN FOR SMALL TARGETS AND INCORPORATION OF SEM TARGET WITH OPTICAL TARGET, the disclosures of which are hereby incorporated by reference and priorities of which are hereby claimed.

Reference is also made to the following patents and patent applications of the Applicant, which are related to the subject matter of the present application, the disclosures of which are hereby incorporated by reference:

U.S. Pat. No. 7,608,468 entitled APPARATUS AND METHODS FOR DETERMINING OVERLAY AND USES OF SAME;

U.S. Pat. No. 9,476,698 entitled PERIODIC PATTERNS AND TECHNIQUE TO CONTROL MISALIGNMENT BETWEEN TWO LAYERS; and U.S. Pat. No. 8,330,281 entitled OVERLAY MARKS, METHODS OF OVERLAY MARK DESIGN AND METHODS OF OVERLAY MEASUREMENTS.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a target for use in the measurement of misregistration between at least one first layer and at least one second layer formed on a wafer in the manufacture of semiconductor devices, the target including a first pair of periodic structures (IPPS) and a second pair of periodic structures (SPPS), each of the FPPS and the SPPS including a first edge axis being generally parallel to a first FPPS edge, a second edge axis being generally parallel to a second FPPS edge, a plurality of first periodic structures formed in a first area as part of a first FPPS layer of the at least one first layer and having a first pitch along a first pitch axis, the first pitch axis not being parallel to either of the first edge axis or second edge axis, and a plurality of second periodic structures formed in a second area as part of a second FPPS layer of the at least one second layer and having the first pitch along a second pitch axis, the second pitch axis being generally parallel to the first pitch axis and the first area and the second area at least partially overlying one another.

In accordance with a preferred embodiment of the present invention, the target also includes a third pair of periodic structures (TPPS) and a fourth pair of periodic structures (FoPPS), each of the TPPS and the FoPPS including a third edge axis being generally parallel to a first TPPS edge, a fourth edge axis being generally parallel to a second TPPS edge, a plurality of third periodic structures formed in a third area as part of a first TPPS layer of the at least one first layer and having a second pitch along a third pitch axis, the third pitch axis not being parallel to either of the third edge axis or fourth edge axis, and a plurality of fourth periodic structures formed in a fourth area as part of a second TPPS layer of the at least one second layer and having the second pitch along a fourth pitch axis, the fourth pitch axis being generally parallel to the third pitch axis and the third area, and the fourth area at least partially overlying one another.

In accordance with a preferred embodiment of the present invention, the first FPPS layer and the first TPPS layer are the same layer and the second FPPS layer and the second TPPS layer are the same layer. Alternatively, in accordance with a preferred embodiment of the present invention, at least one of the first FPPS layer and the first TPPS layer are different layers and the second FPPS layer and the second IPPS layer are different layers.

Preferably, the third pitch axis is generally perpendicular to the first pitch axis. Preferably, the first pitch axis forms a generally 45° angle with the first edge axis. Preferably, the second edge axis is generally perpendicular to the first edge axis.

In accordance with a preferred embodiment of the present invention, portions of the semiconductor devices are generally parallel to a first semiconductor device axis and the first pitch, axis is generally perpendicular to the first semiconductor device axis. Preferably, the target also, includes electron beam sensible portions including a plurality of first features formed as part of the at least one first layer of the wafer and a plurality of second features formed as part of the at least one second layer of the wafer. In a preferred embodiment of the present invention, the FPPS, the SPPS and the electron beam sensible portions are all formed in a single target-dedicated region on the wafer. Preferably, the target is rotationally symmetric about a single point of symmetry.

Alternatively, in accordance with a preferred embodiment of the present invention, portions of the semiconductor devices are generally parallel to a first semiconductor axis, and the first pitch axis is not perpendicular to the first semiconductor device axis. In accordance with a preferred embodiment of the present invention, first pitch axis forms a generally 45° angle with the first semiconductor device axis. Alternatively, in accordance with a preferred embodiment of the present invention, the target has a first size and is formed in a target-dedicated region, the target-dedicated region having a second size, and the target is oriented within the target-dedicated region such that the ratio of the first size to the second size is generally maximized.

Preferably, the first pitch axis, the first edge axis and the second edge axis are arranged such that when either of the FPPS or the SPPS is illuminated by light, there results a desired output signal along a signal axis, the signal axis not being perpendicular to either of the first edge axis or the second edge axis, and a noise output signal along a first noise axis and a second noise axis, the first noise axis being generally perpendicular to the first edge axis and the second noise axis being generally perpendicular to the second edge axis. Preferably, overlap between the noise output signal and the desired output signal is generally minimized.

There is also provided in accordance with another preferred embodiment of the present invention a method of measuring misregistration between at least one first layer and at least one second layer formed on a wafer in the manufacture of semiconductor devices, the method including providing the wafer on which is formed a target including a first pair of periodic structures (FPPS) and a second pair of periodic structures (SPPS), each of the FPPS and the SPPS including a first edge, axis being generally parallel to a first FPPS edge, a second edge axis being generally parallel to a second FPPS edge, a plurality of first periodic structures formed in a first area as part of a first FPPS layer of the at least one first layer and having a first pitch along a first pitch axis, the first pitch axis not being parallel to either of the first edge axis or second edge axis, and a plurality of second periodic structures formed in a second area as part of a second FPPS layer of the at least one second layer and having the first pitch along a second pitch axis, the second pitch axis being generally parallel to the first pitch axis and the first area and the second area at least partially overlying one another, illuminating the target with incident radiation, thereby generating output signals and analyzing the output signal, thereby generating a misregistration value between the layers of the target.

Preferably, the output signal includes a desired output signal along a signal axis, the signal axis not being perpendicular to either of the first edge axis or the second edge axis; and a noise output signal along a first noise axis and a second noise axis, the first noise axis being generally perpendicular to the first edge axis and the second noise axis being generally perpendicular to the second edge axis. Preferably, overlap between the noise output signal and the desired output signal is generally minimized.

In a preferred embodiment of the present invention, the analyzing the output signal includes identifying and removing the noise output signal of the output signal. In a preferred embodiment of the present invention, the output signal is generated by a scatterometry misregistration metrology tool.

BRIEF DESCRIPTION OF THE DRAWINGS

The present invention will be understood and appreciated more fully from the following detailed description, taken in conjunction with the drawings in which:

FIG. 2B is a simplified illustration of an output signal generated by a portion of a prior art target when suitably illuminated;

FIG. 4 is a simplified illustration of an output signal generated by a portion of the target shown in FIGS. 3A-3G when suitably illuminated.

DETAILED DESCRIPTION OF PREFERRED EMBODIMENTS

Figure 1A:
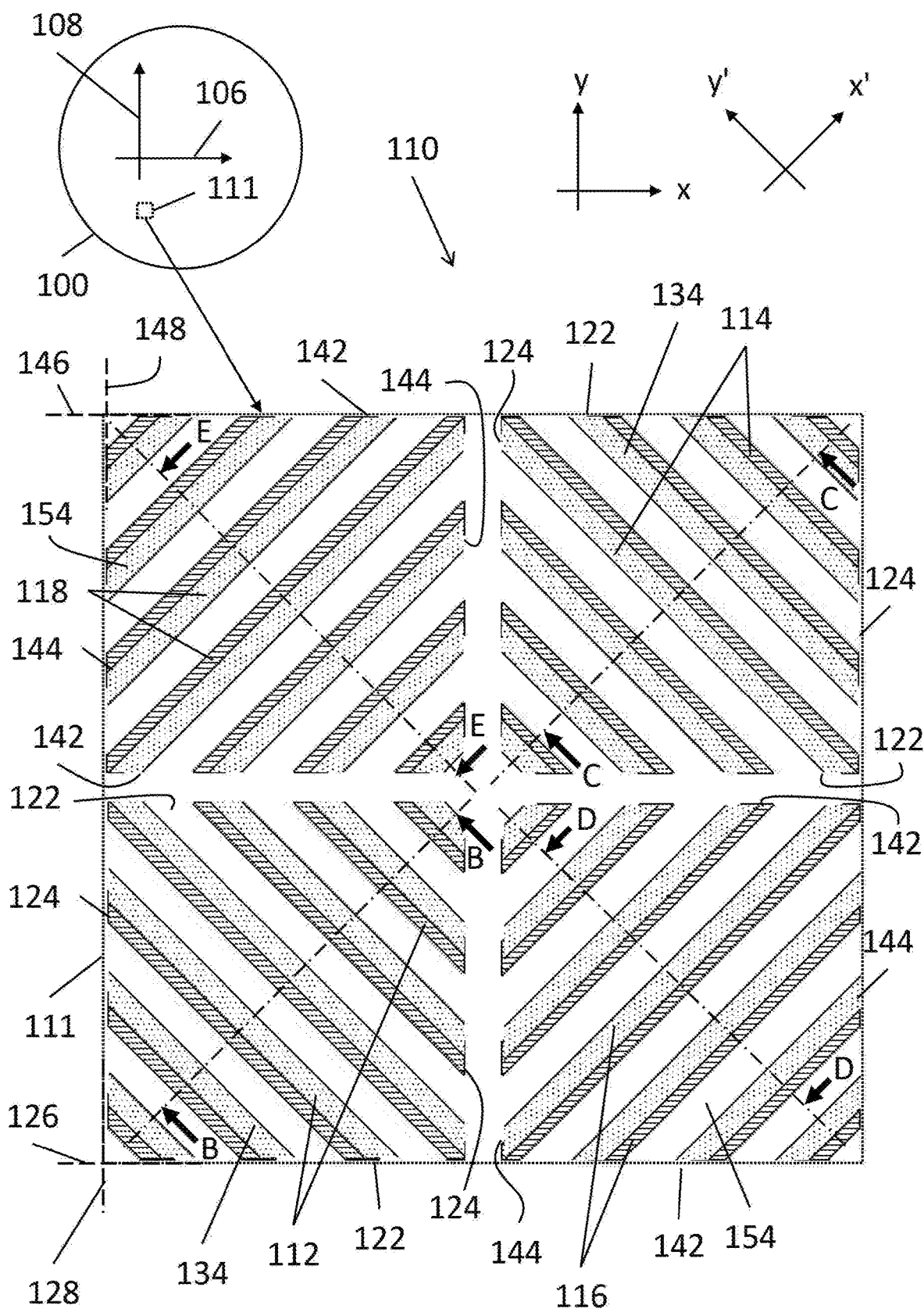
FIG. 1A is a simplified generally top planar illustration of one embodiment of a target of the present invention.

The targets of the present invention, described hereinbelow with reference to FIGS. 1A-5, are preferably used in a system and method to measure misregistration between at least a first layer and a second layer of semiconductor device structures formed on a wafer and are typically formed as part of a manufacturing process for semiconductor devices. The misregistration measured by the system and method described hereinbelow with reference to FIGS. 1A-5 may be used to adjust portions of the manufacturing process for semiconductor devices, such as lithography, to ameliorate misregistration between various layers of the semiconductor devices being fabricated.

The targets described hereinbelow with reference to FIGS. 1A-5 include periodic indicia formed as part of at least the first layer and the second layer formed on the wafer, preferably during the formation of the semiconductor devices on the wafer. The periodic indicia preferably have a pitch of 70 nm-2000 nm, and more preferably of 300 nm-700 nm, and a line width of 10%-90% of the pitch, most typically 50% of the pitch. Each of the periodic indicia may be segmented, though they need not be. In an embodiment, wherein the periodic indicia are segmented, each one of the periodic indicia is defined by a plurality of periodic sub-indicia. Preferably, the pitch of the periodic sub-indicia is the same as or close to the dimension of functional features of the semiconductor devices on the wafer on which the targets are formed, but it need not be.

For example, periodic indicia having a width of 420 nm may be formed of 15 periodic sub-indicia each having a pitch of 14 nm. The layers with which the target is formed may be mutually adjacent layers but need not be, and may be separated by a height ranging from 50 nm to over 10,000 nm. The first layer may be formed below the second layer or the second layer may be formed below the first layer. In some embodiments of the present invention, the first layer and the second layer may be the same layer. Any material between a suitable misregistration tool radiation source and each of the layers is at least partially transparent to radiation generated by the radiation source.

It is further appreciated that although the targets of the present invention are shown in FIGS. 1A-5 as being generally square in shape, the targets may be of any suitable shape. Additionally, the targets of the present invention may be formed in arrays, preferably in such a way that the targets fill a maximum amount of space on the wafer that is allotted for the formation of targets useful in misregistration measurement.

The present invention seeks to provide a target and a method of use thereof, which improve a signal-to-noise ratio (SNR) of a misregistration measurement output signal. More particularly, as described hereinbelow, the SNR is sought to be improved by forming the target in such a way that noise generated by edges of the target during misregistration measurement propagates in a direction such that overlap between the noise and a desired portion of the output signal is generally minimized.

Figure 1B:
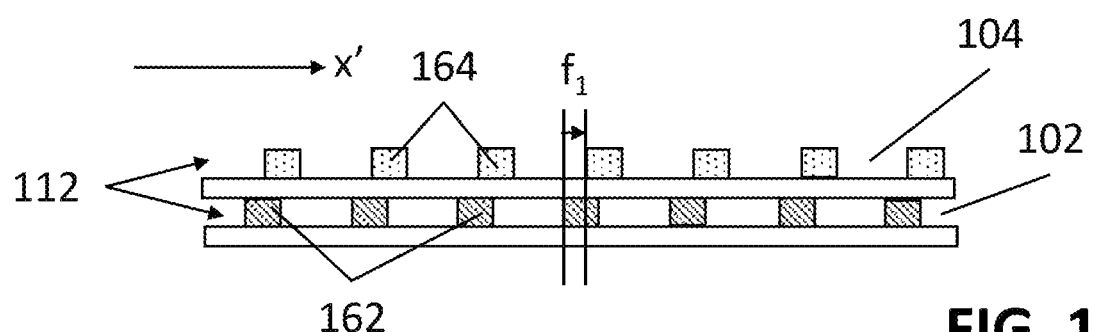
FIGS. 1B, 1C, 1D and 1E are simplified cross-sectional illustrations of the target shown in FIG. 1A, being taken along respective lines B-B, C-C, D-D and E-E in FIG. 1A.
Figure 1C:
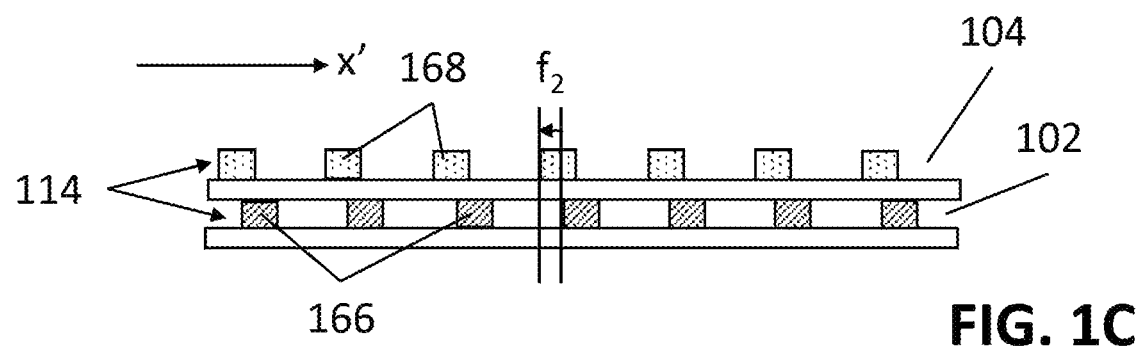
Figure 1D:
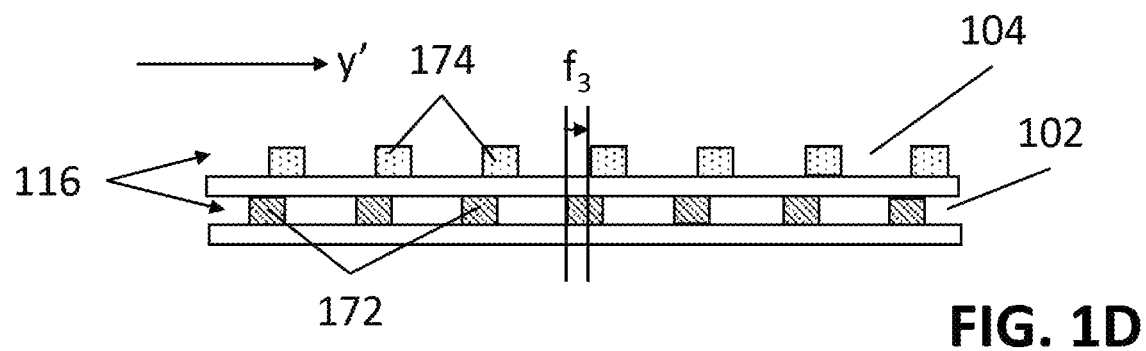
Figure 1E:
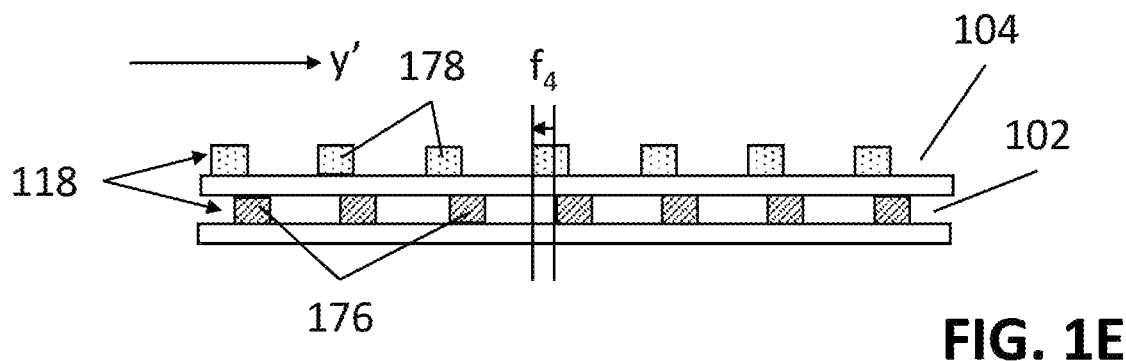
Figure 1F:
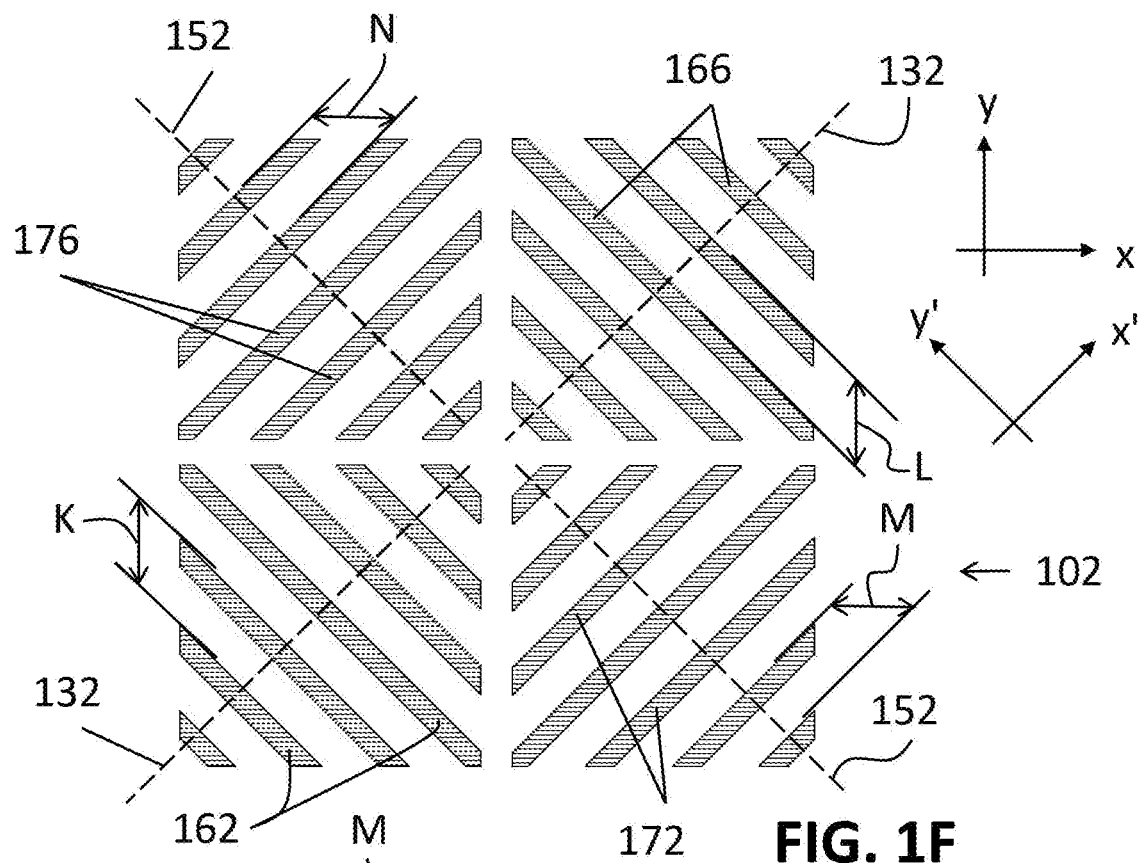
FIGS. 1F and 1G are simplified top planar illustrations of a first layer and a second layer of the target shown in FIGS. 1A-1E, respectively.
Figure 1G:
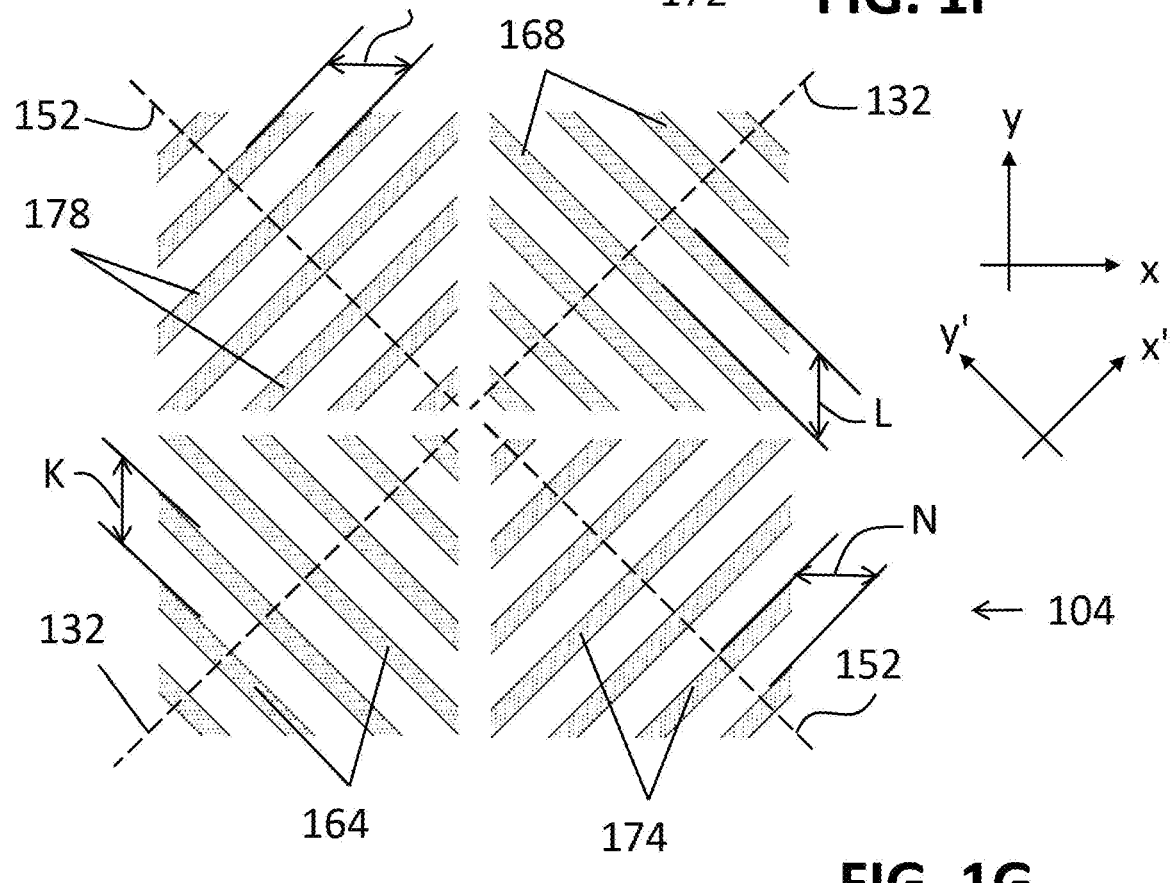

Reference is now made to FIG. 1A, which is a simplified generally top planar illustration of one embodiment, of a target of the present invention, formed OD a wafer, to FIGS. 1B-1E, which are simplified cross-sectional illustrations of the target shown in FIG. 1A, and to FIGS. 1F and 1G, which are simplified top planar illustrations of a first layer and a second layer of the target shown in FIGS. 1A-1E, respectively.

As seen in FIGS. 1A-1G, formed on a wafer 100 are at least a first layer 102 and a second layer 104. Preferably, first layer 102 and second layer 104 include, inter alia, semiconductor device features (not shown), portions of which are generally parallel to either of a semiconductor device axis 106 and semiconductor device axis 108. In FIG. 1A, semiconductor device axis 106 and semiconductor device axis 108 are shown as perpendicular to each other, but they need not be.

It is appreciated that, for ease of understanding, FIGS. 1A-1G are not drawn to scale. It is further appreciated that in a preferred embodiment of the present invention, at least some features shown may be, and typically are, covered by other structures also formed on the wafer.

As seen particularly in FIG. 1A, in one embodiment of the present invention, a target 110 is formed within a target-dedicated region 111 on wafer 100. Typically, the sides of target-dedicated region 111 are generally parallel to one or both of semiconductor device axes 106 and 108. In a preferred embodiment of the present invention, the size and orientation of target 110 is chosen to generally maximize the ratio of the size of target 110 to the size of target-dedicated region 111. Target 110 preferably includes a first pair of periodic structures (FPPS) 112, a second pair of periodic structures (SPPS) 114, a third pair of periodic structures (IPPS) 116 and a fourth pair of periodic structures (FoPPS) 118.

Each of FPPS 112 and SPPS 114 includes a pair of first edges 122 and a pair of second edges 124. Preferably, first edges 122 are generally parallel to a first edge axis 126, and second edges 124 are generally parallel to a second edge axis 128. In the embodiment shown in FIGS. 1A-1G, first edge axis 126 and second edge axis 128 are generally perpendicular to each other, first edge axis 126 being parallel to an x-axis and second edge axis 128 being parallel to a y-axis. In other embodiments of the present invention, first edge axis 126 and second edge axis 128 are not perpendicular to one another. In one embodiment of the present invention, edge axes 126 and 128 are generally parallel to corresponding semiconductor device axes 106 and 108, respectively.

As seen particularly in FIGS. 1F & 1G, periodic structures of each of FPPS 112 and SPPS 114 are preferably periodic along a first pitch axis 132, which is parallel to an x'-axis, and suitable measurement of FPPS 112 and SPPS 114 provides output signals relating to the misregistration between first layer 102 and second layer 104 in the x' direction. As seen particularly in FIG. 1A, FPPS 112 and SPPS 114 together form an x' target portion 134. It is a particular feature of the present invention that first pitch axis 132 is not parallel to either of first, edge axis 126 or second edge axis 128. In a preferred embodiment of the present invention, first pitch axis 132 forms a generally 45° angle with one or both of first edge axis 126 and second edge axis 128.

Similarly, each of TPPS 116 and FoPPS 118 includes a pair of first edges 142 and a pair of second edges 144. Preferably, first edges 142 are generally parallel to a first edge axis 146, and second edges 144 are generally parallel to a second edge axis 148. In the embodiment shown in FIGS. 1A-1G, first edge axis 146 and second edge axis 148 are generally perpendicular to each other, first edge axis 146 being parallel to an x-axis and second edge axis 148 being parallel to a y-axis. In other embodiments of the present invention, first edge axis 146 and second edge axis 148 are not perpendicular to one another. In one embodiment of the present invention, edge axes 146 and 148 are generally parallel to corresponding semiconductor device axes 106 and 108, respectively.

As seen particularly in FIGS. 1F & 1G, periodic structures of each of TPPS 116 and FoPPS 118 are preferably periodic along a second pitch axis 152, which is parallel to a y'-axis, and suitable measurement of TPPS 116 and FoPPS 118 provides output signals relating to the misregistration between first layer 102 and second layer 104 in the y' direction. As seen particularly in FIG. 1A, TPPS 116 and FoPPS 118 together form a y' target portion 154. It is a particular feature of the present invention that second pitch axis 152 is, not parallel to either of first edge axis 126 or second edge axis 128. In a preferred embodiment of the present invention, second pitch axis 152 forms a generally 45° angle with one or both of first edge axis 126 and second edge axis 128.

As seen, in FIGS. 1B-1G, FPPS 112 preferably includes a plurality of first periodic structures 162 formed as part of first layer 102 and a plurality of second periodic structures 164 formed as part of second layer 104. Preferably, SPPS 114 includes a plurality of first periodic structures 166 formed as part of first layer 102 and a plurality of second periodic structures 168 formed as part of second layer 104. Preferably, the area of FPPS 112 in which first periodic structures 162 are formed and the area of FPPS 112 in which second periodic structures 164 are formed at least partially overlie one another. Similarly, the area of SPPS 114 in which first periodic structures 166 are formed and the area of SPPS 114 in which second periodic structures 168 are formed at least partially overlie one another.

Preferably, periodic structures 162 and 164 are characterized by a pitch, K, along first pitch axis 132 and periodic structures 166 and 168 are characterized by a pitch, L, along first pitch axis 132. In a preferred embodiment of the present invention, pitch K and pitch L have the same value. Preferably, as seen particularly in FIG. 1B, second periodic structures 164 are shifted by a predetermined distance in the x' direction with respect to first periodic structures 162. The size and direction of the shift between first periodic structures 162 and second periodic structures 164 is expressed as a first predetermined offset (FPO), $f_1$. FPO $f_1$ is characterized by a first direction along an axis parallel to the x'-axis and a first magnitude. FPO $f_1$ preferably has a magnitude of 10 nm-100 nm, and more preferably of 15 nm-25 nm.

It is appreciated that, as described hereinabove, the magnitude and direction of FPO $f_1$ characterize the shift between first periodic structures 162 and second periodic structures 164 when target 110 is in a state of perfect registration. In a typical case, wherein misregistration between layers 102 and 104 is not equal to zero, the actual shift between first periodic structures 162 and second periodic structures 164 is equal to the vector sum of FPO $f_1$ and the misregistration.

Similarly, as seen particularly in FIG. 1C, second periodic structures 168 are shifted by a predetermined distance in the x' direction with respect to first periodic structures 166. The size and direction of the shift between first periodic structures 166 and second periodic structures 168 is expressed as a second predetermined offset (SPO), $f_2$. SPO $f_2$ is characterized by a second direction along an axis parallel to the x'-axis and a second magnitude. SPO $f_2$ preferably has a magnitude of 10 nm-100 nm, and more preferably of 15 nm-25 nm. In a preferred embodiment of the present invention, the magnitude of SPO $f_2$ has the same value as the magnitude of FPO $f_1$, and the direction of SPO $f_2$ is opposite the direction of FPO $f_1$.

It is appreciated that, as described hereinabove, the magnitude and direction of SPO $f_2$ characterize the shift between first periodic structures 166 and second periodic structures 168 when target 110 is in a state of perfect registration. In a typical case, wherein misregistration between layers 102 and 104 is not equal to zero, the actual shift between first periodic structures 166 and second periodic structures 168 is equal to the vector sum of SPO $f_2$, and the misregistration.

As seen particularly in FIGS. 1D & 1E, TPPS 116 preferably includes a plurality of first periodic structures 172 formed as part of first layer 102 and a plurality of second periodic structures 174 formed as part of second layer 104. Preferably, FoFPS 118 includes a plurality of first periodic structures 176 formed as part of first layer 102 and a plurality of second periodic structures 178 formed as part of second layer 104.

In another embodiment of the present invention, x' target portion 134 may be used in the measurement of misregistration between a first pair of layers formed on wafer 100, and y' target portion 154 may be used in the measurement of misregistration between a different pair of layers formed on wafer 100. In one such embodiment, periodic structures 162, 164, 166 and 168 of x' target portion 134 are formed as part of layers 102 and 104, while periodic structures 172, 174, 176 and 178 of y' target portion 154 are formed as part of layers on wafer 100 other than layer 102 and layer 104. In another such embodiment, periodic structures 162, 164, 166 and 168 of x' target portion 134 are formed as part of layers 102 and 104, while some of periodic structures 172, 174, 176 and 178 of y' target portion 154 are formed as part of one of layers 102 and 104, while the rest of periodic structures 172, 174, 176 and 178 are formed as part of a layer on wafer 100 that is neither layer 102 nor layer 104.

Preferably, the area of TPPS 116 in which first periodic structures 172 are formed and the area of TPPS 116 in which second periodic structures 174 are formed at least partially overlie one another. Similarly, the area of FoPPS 118 in which first, periodic structures 176 are formed and the area of FoPPS 118 in which second periodic structures 178 are formed at least partially overlie one another.

Preferably, periodic structures 172 and 174 are characterized by a pitch, M, along second pitch axis 152 and periodic structures 176 and 178 are characterized by a pitch, N, along second pitch axis 152. In a preferred embodiment of the present invention, pitch M and pitch N have the same value. In other embodiments of the present invention, any or all of pitches K, L, M and N have the same values. Preferably, as seen particularly in FIG. 1D, second periodic structures 174 are shifted by a predetermined distance in the y' direction with respect to first periodic structures 172. The size and direction of the shift between first periodic structures 172 and second periodic structures 174 is expressed as a third predetermined offset (TPO), $f_3$. TPO $f_3$ is characterized by a first direction along an axis parallel to the y'-axis and a third magnitude. TPO $f_3$ preferably has a magnitude of 10 nm-100 nm, and more preferably of 15 nm-25 nm.

It is appreciated that, as described hereinabove, the magnitude and direction of TPO $f_3$ characterize the shift between first periodic structures 172 and second periodic structures 174 when target 110 is in a state of perfect registration. In a typical case, wherein-misregistration between layers 102 and 104 is not equal to zero, the actual shift between first, periodic structures 172 and second periodic structures 174 is equal to the vector sum of TPO 6 and the misregistration.

Similarly, as seen particularly in FIG. 1E, second periodic structures 178 are shifted by a predetermined distance in the y' direction with respect to first periodic structures 176. The size and direction of the shift between first periodic structures 176 and second periodic structures 178 is expressed as a fourth predetermined offset (FoPO), $f_4$. FoPO $f_4$ is characterized by a second direction along an axis parallel to the y'-axis and a fourth magnitude. FoPO $f_4$ preferably has a magnitude of 10 nm-100 nm, and more preferably of 15 nm-25 nm. In a preferred embodiment of the present invention, the magnitude of FoPO $f_4$ has the same value as the magnitude of TPO $f_3$, and the direction of FoPO $f_4$ is opposite the direction of TPO $f_3$.

It is appreciated that, as described hereinabove, the magnitude and direction of FoPO $f_4$ characterize the shift between first periodic structures 176 and second periodic structures 178 when target 110 is in a state of perfect registration. In a typical case, wherein misregistration between layers 102 and 104 is not equal to zero, the actual shift between first periodic structures 176 and second periodic structures 178 is equal to the vector sum of FoPO $f_4$ and the misregistration.

In the embodiment shown in FIGS. 1A-1G, as seen particularly in FIG. 1B, individual periodic structures of first periodic structures 162 and second periodic structures 164 fully or partially overlie each other. In another embodiment of the present invention, although the areas in which first periodic structures 162 and second periodic structures 164 are formed overlie each other, the chosen line widths of first periodic structures 162, line widths of second periodic structures 164, pitch K, pitch L, FPO $f_1$ and SPO $f_2$ may result in individual periodic structures of first periodic structures 162 and second periodic structures 164 alternating in the x' direction with no overlap between individual periodic structures. Similarly, in another embodiment of the present invention, the chosen line widths of first periodic structures 162, line widths of second periodic structures 164, pitch K, pitch L, FPO $f_1$ and SPO $f_2$ may result in some of individual periodic structures of first periodic structures 162 and second periodic structures 164 fully or partially overlying each other, and some of individual periodic structures of first periodic structures 162 and second periodic structures 164 alternating in the x' direction with each other.

Similarly, individual periodic structures of first periodic structures 166 and second periodic structures 168, first periodic structures 172 and second periodic structures 174, and first periodic structures 176 and second periodic structures 178 may either overlie or alternate with each other.

It is appreciated that although target 110, as in the embodiment shown in FIGS. 1A-1G and described hereinabove, includes both x' target portion 134 and y' target portion 154, in another embodiment of the present invention, target 110 may include only one of x' target portion 134 and y' target portion 154. Such a target is useful in the measurement of misregistration between layers 102 and 104 in the x' direction or y' direction, respectively.

Figure 2A:
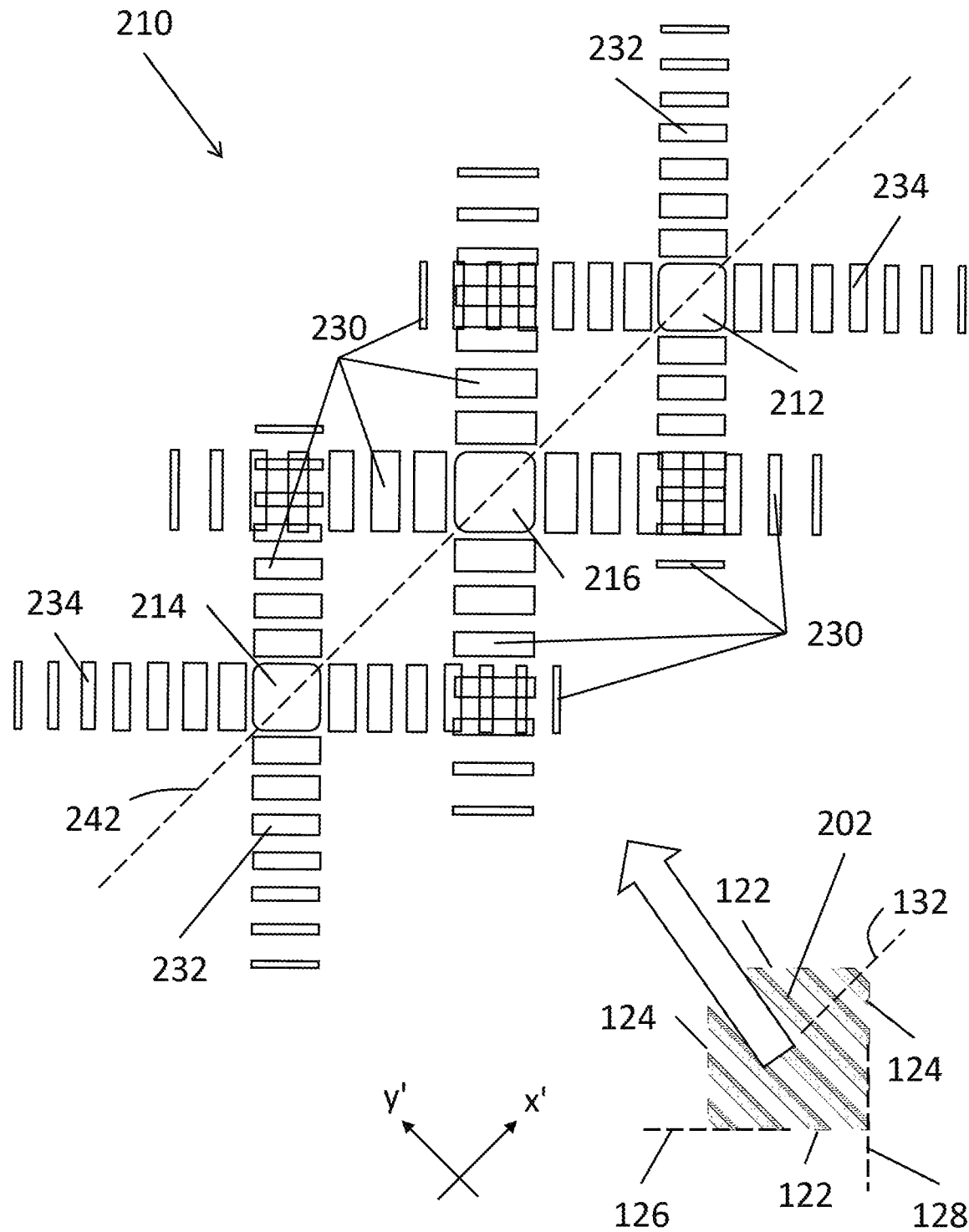
FIG. 2A is a simplified illustration of an output signal generated by a portion of the target shown in FIGS. 1A-1G when suitably illuminated.

Reference is now additionally made to FIG. 2A, which is a simplified illustration of an output signal generated by a portion of target 110 when suitably illuminated, and to FIG. 2B, which is a simplified illustration of an output signal generated by a portion of a prior art target when suitably illuminated. It is appreciated that FIGS. 2A and 2B are illustrative in nature, and are not drawn to scale.

As seen in FIG. 2A, an x' target cell 202, being one of FPPS 112 or SPPS 114, generates an output signal 210 upon suitable illumination and measurement by a scatterometry misregistration metrology tool. An example of a scatterometry misregistration metrology tool useful in the measurement of target 110 is an ATL™ 100, commercially available from KLA Corporation of Milpitas, Calif., USA.

Output signal 210 typically includes a desired signal portion 212, generated by positive first-order diffraction of incident radiation, by x' target cell 202, and a desired signal portion 214, generated by negative first-order diffraction of incident radiation by x' target cell 202.

As is known in the art and described in further detail in U.S. Pat. Nos. 9,476,698, 8,330,281 and M. Adel, D. Kandel, V. Levinski, J. Seligson, A. Kuniaysky, "Diffraction order control in overlay metrology: a review of the roadmap options," Proc. SPIE 6922, Metrology, Inspection, and Process Control for Microlithography XXII, 692202 (14 Mar. 2008), a difference between desired signal portion 212 and desired signal portion 214 is a function of misregistration in the x' direction between layers 102 and 104, and misregistration between layers 102 and 104 in the x' direction may be calculated from output signal 210.

Output signal 210 typically further includes a signal portion 216, generated by 0th-order diffraction of incident radiation by x' target cell 202. Associated with each of signal portions 212, 214 and 216 are a plurality of noise portions 230. Noise portions 230 include noise portions 232, which are generated by diffraction of incident radiation by edges 122 of x' target cell 202, and noise portions 234, which are generated by diffraction of incident radiation by edges 124 of x' target cell 202.

As is known in the art, as with all similar structures, edges 122 and 124 of x' target cell 202 diffract incident radiation in a direction generally perpendicular to respective edge axes 126 and 128. Thus, noise portions 232 of output signal 210 propagate generally along a noise axis generally perpendicular to edge axis 126 and noise portions 234 propagate generally along a noise axis generally perpendicular to edge axis 128. As is known in the art, as with all similar periodic structures, FPPS 112 and SPAS 114 each diffract incident radiation in a direction generally parallel to pitch axis 132. Thus, desired signal portions 212 and 214 of output signal 210 are located along an axis 242, being generally parallel to corresponding pitch axis 132.

Since pitch axis 132 is not perpendicular to either of edge axes 126 or 128, when illuminating x' target cell 202 of target 110 of the present invention with suitable incident radiation, the axes along which noise portions 230, generated by diffraction of incident radiation by edges 122 and 124, propagate are not parallel to axis 242 along which desired signal portions 212 and 214, diffracted by x' target cell 202, propagate. Thus, as seen in FIG. 2A, the undesired contributions of noise portions 230 to output signal 210 of target 110 can be readily identified and removed, thereby improving the SNR of output signal 210.

In a most preferred embodiment of the present invention, in which pitch axis 132 forms a generally 45° angle with both of edge axes 126 and 128, the axes along which noise portions 230 propagate are located at a maximum possible planar radial distance from axis 242 along which desired signal portions 212 and 214, diffracted by FPPS 112 and SPPS 114, propagate. Thus, the undesired contributions of noise portions 230 to output signal 210 can be readily identified and removed, thereby improving the SNR of output signal 210.

In contrast, as seen in FIG. 2B, in prior art targets useful in the measurement of misregistration between layers formed on a wafer of semiconductor devices, the targets include a plurality of target cells 250, which are each formed with pairs of edges 252 and 254. Target cells 250 typically include periodic structures 262 and 264, which are generally periodic along a pitch axis 272, pitch axis 272 being generally perpendicular to one of pairs of edges 252 and 254. In the embodiment of the prior art target cell shown in FIG. 2B, pitch axis 272 is generally perpendicular to edges 252.

Upon measurement by a suitable scatterometry misregistration measurement tool, target cell 250 generates a signal 280. Signal 280 typically includes desired signal portions 282 and 284, 0$^{th}$-order diffraction of incident radiation signal portion 286, noise portions 292, which are generated by diffraction of incident radiation by edges 252 of target cell 250, and noise portions 294, which are generated by diffraction of incident radiation by edges 254 of target cell 250.

Since pitch axis 272 is generally perpendicular to edges 252, both noise portions 292 and desired signal portions 282 tend to propagate along a single axis 296. Thus, the undesired contributions of noise 292 to output signal 280 cannot be readily identified and removed, and thus, output signal 280 has a lower SNR than the SNR of the targets of the present invention.

It is appreciated that while FIG. 2A shows output signal 210 for only a single one of FPPS 112 or SPPS 114, typically both of FPPS 112 and SPPS 114 are measured, and output signals 210 from both of FPPS 112 and SPPS 114 are analyzed in order to determine both a magnitude and a direction of misregistration in the x' direction between layers 102 and 104.

It is appreciated that upon suitable illumination and measurement of each of TPPS 116 and FoPPS 118 by a scatterometry misregistration measurement tool, an output signal, similar to output signal 210 described hereinabove with reference to FIG. 2A, is generated. Typically, the output signal generated by each of TPPS 116 and FoPPS 118 is qualitatively identical, to an output signal 210 that has been rotated such that axis 242 is parallel to pitch axis 152. Thus, misregistration in the y' direction between layers 102 and 104 may be calculated from the output signals generated by TPPS 116 and FoPPS 118.

More particularly, each of the output signals generated by TPPS 116 or FoPPS 118 includes desired signal portions of the output signal similar to desired signal portions 212 and 214, which are located along an axis being generally parallel to corresponding pitch axis 152. Typically, each of the output signals generated by TPPS 116 or FoPPS 118 further include noise portions, similar to noise portions 230, which propagate in a different direction than that of axis 152.

Figure 3A:
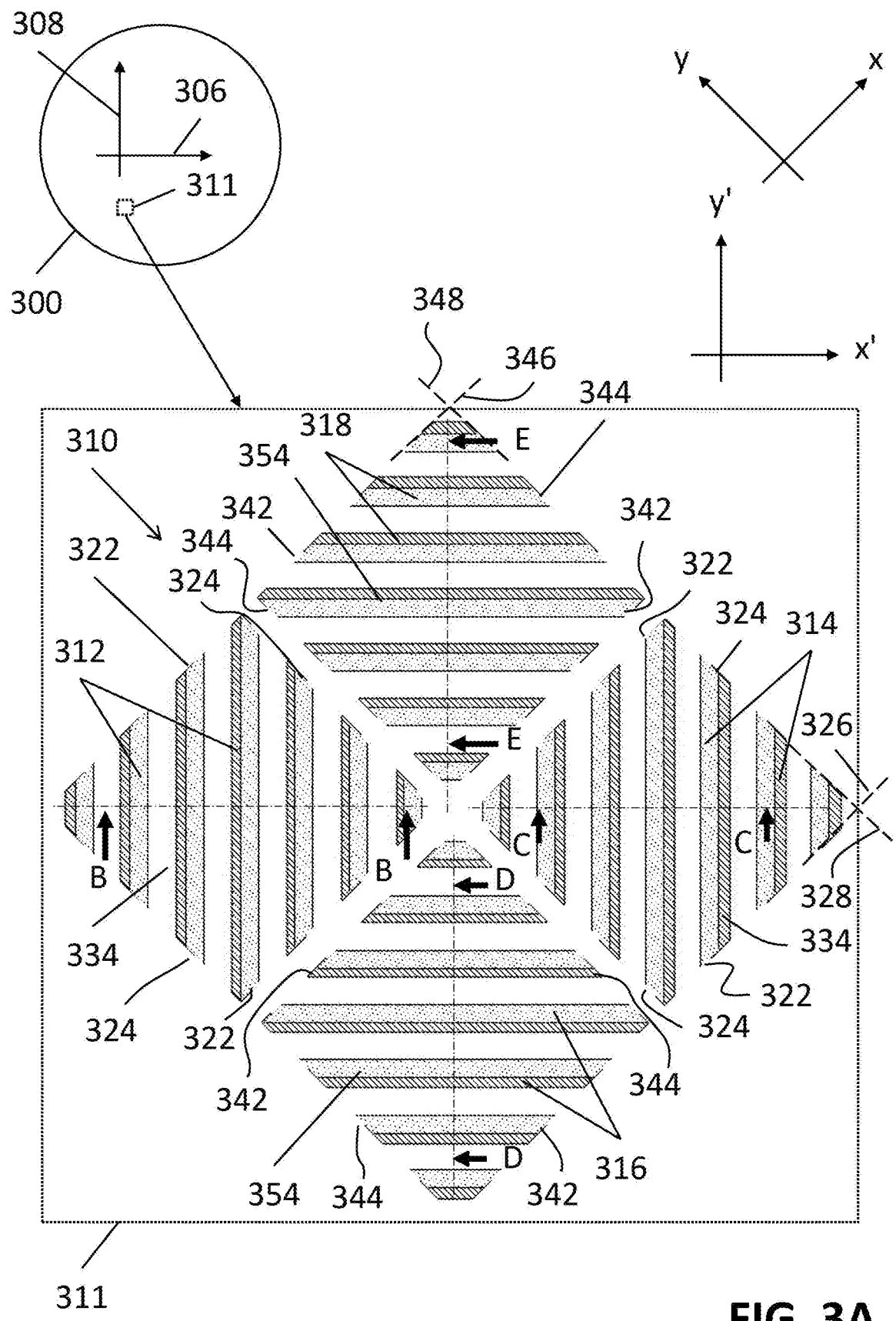
FIG. 3A is a simplified generally top planar illustration of a preferred embodiment of a target of the present invention.
Figure 3B:
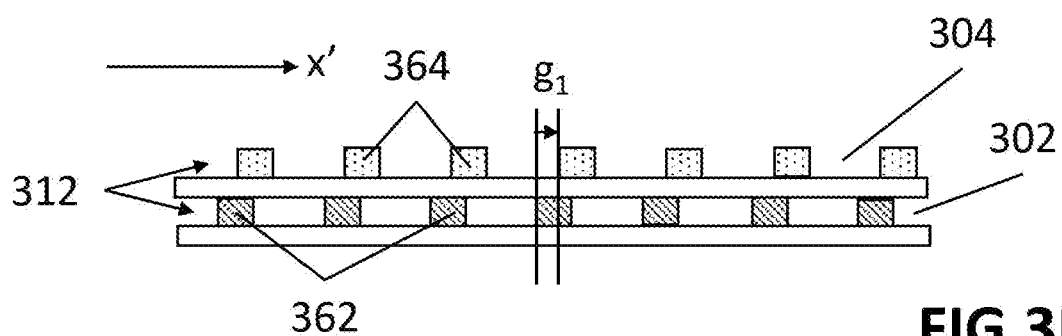
FIGS. 3B, 3C, 3D and 3E are simplified cross-sectional illustrations of the target shown in FIG. 3A, being taken along respective lines B-B, C-C, D-D and E-E in FIG. 3A.
Figure 3C:
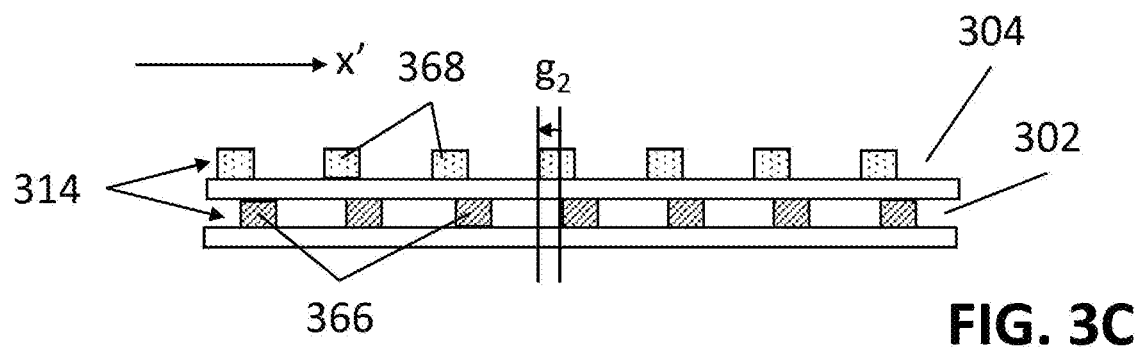
Figure 3D:
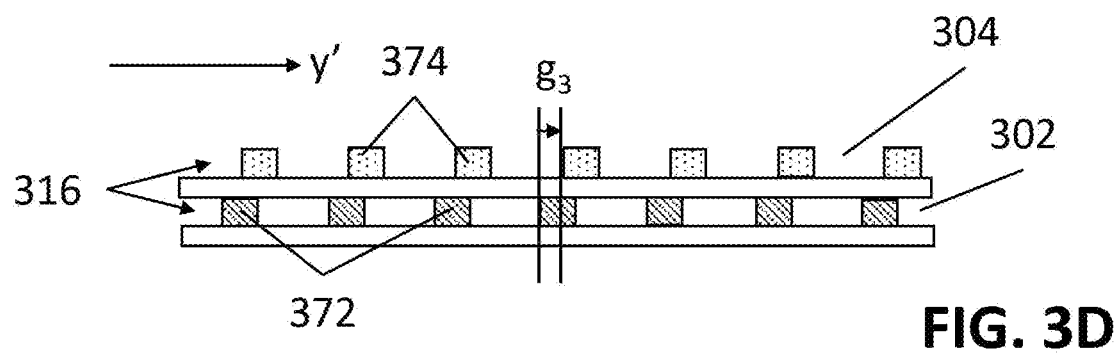
Figure 3E:
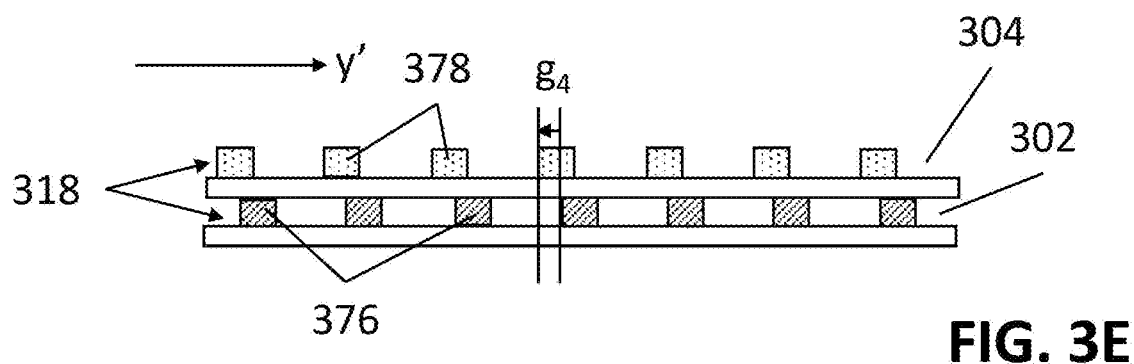
Figure 3F:
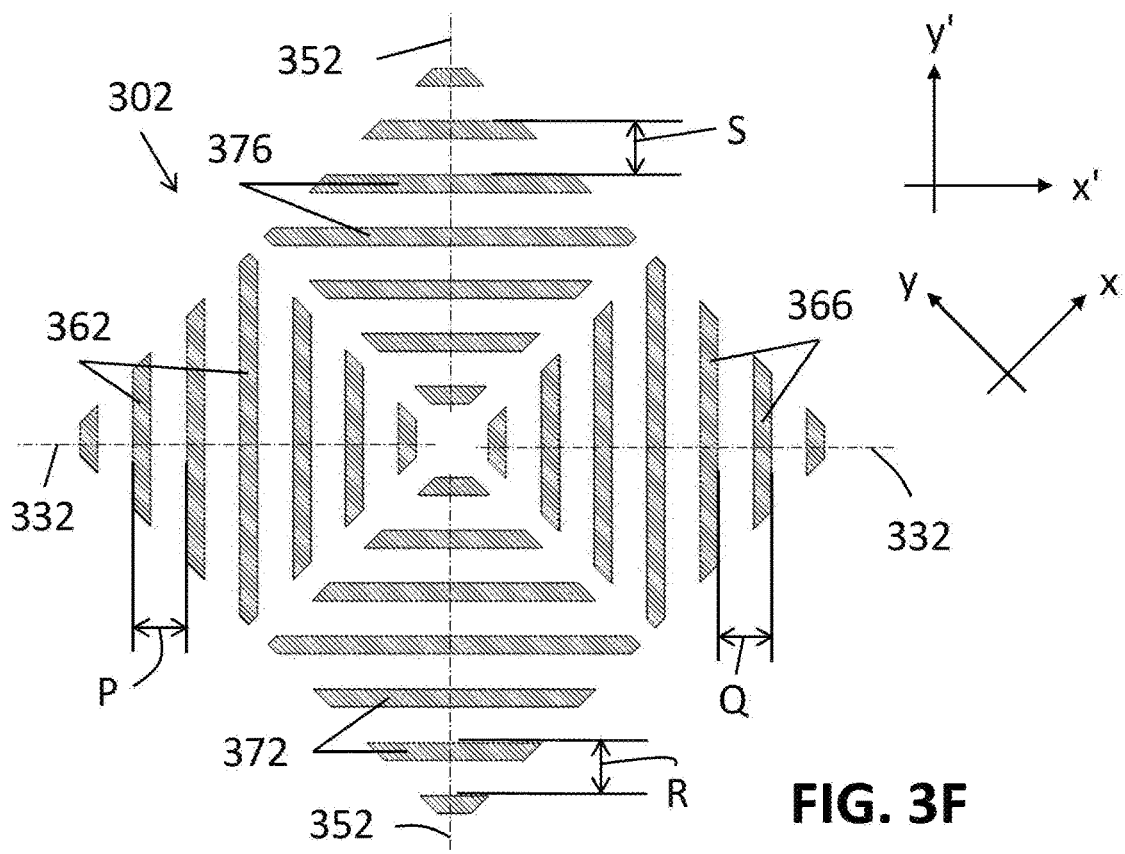
FIGS. 3F and 3G are simplified top planar illustrations of a first layer and a second layer of the target shown in FIGS. 3A-3E, respectively.
Figure 3G:
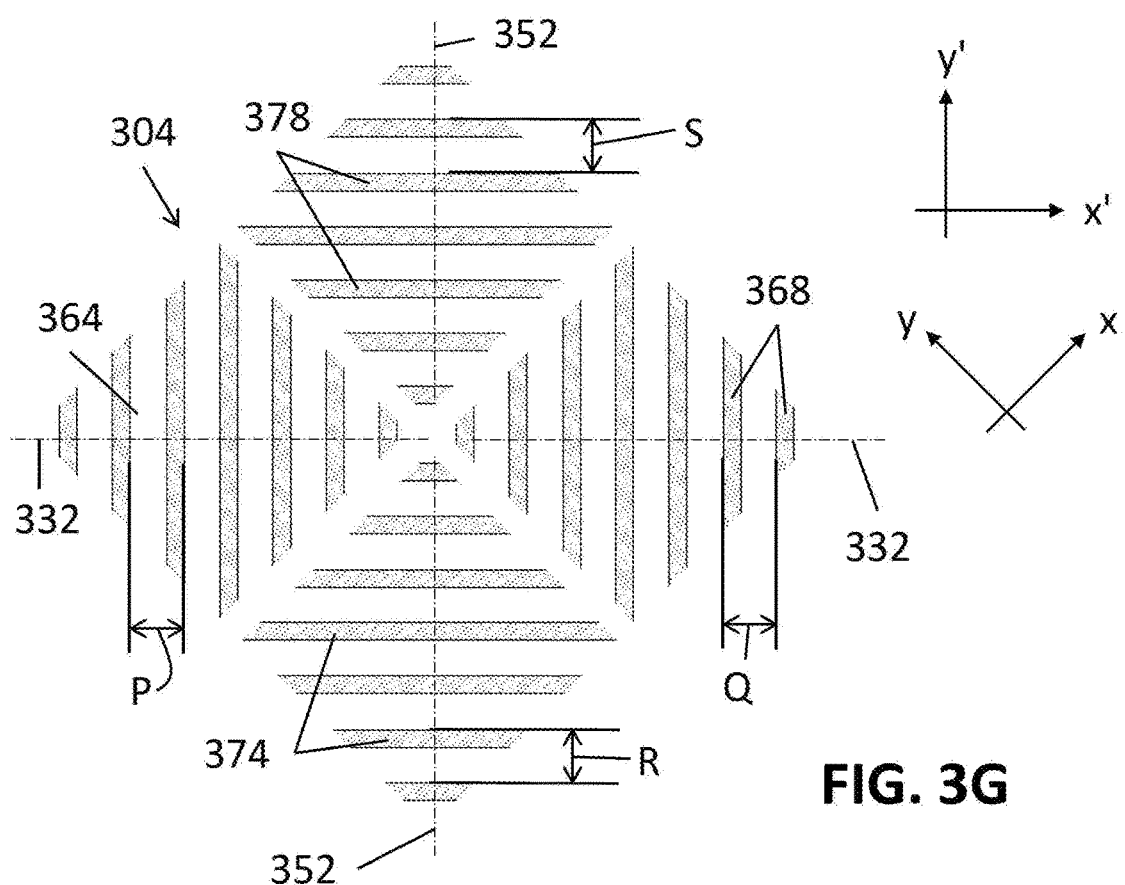

Reference is now made to FIG. 3A, which is a simplified generally top planar illustration of a preferred embodiment of a target of the present invention, formed on a wafer, to FIGS. 3B-3E, which are simplified cross-sectional illustrations of the target shown in FIG. 3A, and to FIGS. 3F and 3G, which are simplified top planar illustrations of a first layer and a second layer of the target shown in FIGS. 3A-3E, respectively.

As seen in FIGS. 3A-3G, formed on a wafer 300 are at least a first layer 302 and a second layer 304. Preferably, first layer 302 and second layer 304 include, inter alia, semiconductor device features (not shown), portions of which are generally parallel to either of a semiconductor device axis 306 and semiconductor device axis 308. In FIG. 3A, semiconductor device axis 306 and semiconductor device axis 308 are shown as perpendicular to each other, but they need not be.

It is appreciated that, for ease of understanding, FIGS. 3A-3G are not drawn to scale. It is further appreciated that in a preferred embodiment of the present invention, at least some features shown may be, and typically are, covered by other structures also formed on the wafer.

As seen particularly in FIG. 3A, in one embodiment of the present invention, a target 310 is formed within a target-dedicated region 311 on wafer 300. Typically, the sides of target-dedicated region 311 are generally parallel to one or both of semiconductor device axes 306 and 308. In a preferred embodiment of the present invention, the size of target 310 is chosen to generally maximize the ratio of the size of target 310 to the size of target-dedicated region 311. Target 310 preferably includes a first pair of periodic structures (FPPS) 312, a second pair of periodic structures (SPPS) 314, a third pair of periodic structures (IPPS) 316 and a fourth pair of periodic structures (FoPPS) 318.

Each of FPPS 312 and SPPS 314 includes a pair of first edges 322 and a pair of second edges 324. Preferably, first edges 322 are generally parallel to a first edge axis 326, and second edges 324 are generally parallel to a second edge axis 328. In the embodiment shown in FIGS. 3A-3G, first edge axis 326 and second edge axis 328 are generally perpendicular to each other, first edge axis 326 being parallel to an x-axis and second edge axis 328 being parallel to a y-axis. In other embodiments of the present invention, first edge axis 326 and second edge axis 328 are not perpendicular to one another. In a preferred embodiment of, the present invention, edge axes 326 and 328 form a generally 45° angle with corresponding semiconductor device axes 306 and 308, respectively.

As seen particularly in FIGS. 3F & 3G, periodic structures of each of FPPS 312 and SPPS 314 are preferably periodic along a first pitch axis 332, which is parallel to an x'-axis, and suitable measurement of FPPS 312 and SPPS 314 provides output signals relating to the misregistration between first layer 302 and second layer 304 in the x' direction. In a preferred embodiment of the present invention, the x' direction is the same as the direction as that of semiconductor device axis 306. As seen particularly in FIG. 3A, FPPS 312 and SPPS 314 together form an x' target portion 334. It is a particular feature of the present invention that first pitch axis 332 is not parallel to either of first edge axis 326 or second edge axis 328. In a preferred embodiment of the present invention, first pitch axis 332 forms a generally 45° angle with one or both of first edge axis 326 and second edge axis 328.

Similarly, each of TPPS 316 and FoPPS 318 includes a pair of first edges 342 and a pair of second edges 344. Preferably, first edges 342 are generally parallel to a first edge axis 346, and second edges 344 are generally parallel to a second edge axis 348. In the embodiment shown in FIGS. 3A-3G, first edge axis 346 and second edge axis 348 are generally perpendicular to each other, first edge axis 346 being parallel to an x-axis and second edge axis 348 being parallel to a y-axis. In other embodiments of the present invention, first edge axis 346 and second edge axis 348 are not perpendicular to one another. In a preferred embodiment of the present invention, edge axes 346 and 348 form a generally 45° angle with corresponding semiconductor device axes 306 and 308, respectively.

As seen particularly in FIGS. 3F & 3G, periodic structures of each of TPPS 316 and FoPPS 318 are preferably periodic along a second pitch axis 352, which is parallel to a y'-axis, and suitable measurement of TPPS 316 and FoPPS 318 provides output signals relating to the misregistration between first layer 302 and second layer 304 in the y' direction. In a preferred embodiment of the present invention, the y' direction is the same as the direction as that of semiconductor device axis 308. As seen particularly in FIG. 3A, TPPS 316 and FoPPS 318 together form a y' target portion 354. It is a particular feature of the present invention that second pitch axis 352 is not parallel to either of first edge axis 326 or second edge axis 328. In a preferred embodiment of the present invention, second pitch axis 352 forms a generally 45° angle with one or both of first edge axis 326 and second edge axis 328.

As seen in FIGS. 3B-3G, FPPS 312 preferably includes a plurality of first periodic structures 362 formed as part of first layer 302 and a plurality of second periodic structures 364 formed as part of second layer 304. Preferably, SPPS 314 includes a plurality of first periodic structures 366 formed as part of first layer 302 and a plurality of second periodic structures 368 formed as part of second layer 304. Preferably, the area of FPPS 312 in which first periodic structures 362 are formed and the area of FPPS 312 in which second periodic structures 364 are formed at least partially overlie one another. Similarly, the area of SPPS 314 in which first periodic structures 366 are formed and the area of SPPS 314 in which second periodic structures 368 are formed at least partially overlie one another.

Preferably, periodic structures 362 and 364 are characterized by a pitch, P, along first pitch axis 332 and periodic structures 366 and 368 are characterized by a pitch, Q, along first pitch axis 332. In a preferred embodiment of the present invention, pitch P and pitch Q have the same value. Preferably, as seen particularly in FIG. 3B, second periodic structures 364 are shifted by a predetermined distance in the x' direction with respect to first periodic structures 362. The size and direction of the shift between first periodic structures 362 and second periodic structures 364 is expressed as a first predetermined offset (FPO), $g_1$. FPO $g_1$ is characterized by a first direction along an axis parallel to the x'-axis and a first magnitude. FPO $g_1$ preferably has a magnitude of 10 nm-100 nm, and more preferably of 15 nm-25 nm.

It is appreciated that, as described hereinabove, the magnitude and direction of FPO $g_1$ characterize the shift between first periodic structures 362 and second periodic structures 364 when target 310 is in a state of perfect registration. In a typical case, wherein misregistration between layers 302 and 304 is not equal to zero, the actual shift between first periodic structures 362 and second periodic structures 364 is equal to the vector sum of FPO $g_1$ and the misregistration.

Similarly, as seen particularly in FIG. 3C, second periodic structures 368 are shifted by a predetermined distance in the x' direction with respect to first periodic structures 366. The size and direction of the shift between first periodic structures 366 and second periodic structures 368 is expressed as a second predetermined offset (SPO), $g_2$. SPO $g_2$ is characterized by a second direction along an axis parallel to the x'-axis and a second magnitude. SPO $g_2$ preferably has a magnitude of 10 nm-100 nm, and more preferably of 15 nm-25 nm. In a preferred embodiment of the present invention, the magnitude of SPO $g_2$ has the same value as the magnitude of FPO $g_1$, and the direction of SPO $g_2$ is opposite the direction of FPO $g_1$.

It is appreciated that, as described hereinabove, the magnitude and direction of SPO $g_2$ characterize the shift between first periodic structures 366 and second periodic structures 368 when target 310 is in a state of perfect registration. In a typical case, wherein misregistration between layers 302 and 304 is not equal to zero, the actual shift between first periodic structures 366 and second periodic structures 368 is equal to the vector sum of SPO $g_2$ and the misregistration.

As seen particularly in FIGS. 3D & 3E, TPPS 316 preferably includes a plurality of first periodic structures 372 formed as part of first layer 302 and a plurality of second periodic structures 374 formed as part of second layer 304. Preferably, FoPPS 318 includes a plurality of first periodic structures 376 formed as part of first layer 302 and a plurality of second periodic structures 378 formed as part of second layer 304.

In another embodiment of the present invention, x' target portion 334 may be used in the measurement of misregistration between a first pair of layers formed on wafer 300, and y' target portion 354 may be used in the measurement of misregistration between a different pair of layers formed on wafer 300. In one such embodiment, periodic structures 362, 364, 366 and 368 of x' target portion 334 are formed as part of layers 302 and 304, while periodic structures 372, 374, 376 and 378 of y' target portion 354 are formed as part of layers on wafer 300 other than layer 302 and layer 304. In another such embodiment periodic structures 362, 364, 366 and 368 of x' target portion 334 are formed as part of layers 302 and 304, while some of periodic structures 372, 374, 376 and 378 of y target portion 354 are formed as part of one of layers 302 and 304, while the rest of periodic structures 372, 374, 376 and 378 are formed as part of a layer on wafer 300 that is neither layer 302 nor layer 304.

Preferably, the area of TPPS 316 in which first periodic structures 372 are formed and the area of TPPS 316 in which second periodic structures 374 are formed at least partially overlie one another. Similarly, the area of FoPPS 318 in which first periodic structures 376 are formed and the area of FoPPS 318 in which second periodic structures 378 are formed at least partially overlie one another.

Preferably, periodic structures 372 and 374 are characterized by a pitch, R, along second pitch axis 352 and periodic structures 376 and 378 are characterized by a pitch, S, along second pitch axis 352. In a preferred embodiment of the present invention, pitch R and pitch S have the same value. In other embodiments of the present invention, any or all of pitches P, Q, R and S have the same values. Preferably, as seen particularly in FIG. 3D, second periodic structures 374 are shifted by a predetermined distance in the y' direction with respect to first periodic structures 372. The size and direction of the shift between first periodic structures 372 and second periodic structures 374 is expressed as a third predetermined offset (TPO), $g_3$. TPO $g_3$ is characterized by a first direction along an axis parallel to the y'-axis and a third magnitude. TPO $g_3$ preferably has a magnitude of 10 nm-100 nm, and more preferably of 15 nm-25 nm.

It is appreciated that, as described hereinabove, the magnitude and direction of TPO $g_3$ characterize the shift between first periodic structures 372 and second periodic structures 374 when target 310 is in a state of perfect registration. In a typical case, wherein misregistration between layers 302 and 304 is not equal to zero, the actual shift between first, periodic structures 372 and second periodic structures 374 is equal to the vector sum of TPO $g_3$ and the misregistration.

Similarly, as seen particularly in FIG. 3E, second periodic structures 378 are shifted by a predetermined distance in the y' direction with respect to first periodic structures 376. The size and direction of the shift between first periodic structures 376 and second periodic structures 378 is expressed as a fourth predetermined offset (FoPO), $g_4$. FoPO $g_4$ is characterized by a second direction along an axis parallel to the y'-axis and a fourth magnitude. FoPO $g_4$ preferably has a magnitude of 10 nm-100 nm, and more preferably of 15 nm-25 nm. In a preferred, embodiment of the present invention, the magnitude of FoPO $g_4$ has the same value as the magnitude of TPO $g_3$, and the direction of FoPO $g_4$ is, opposite the direction of TPO $g_3$.

It is appreciated that, as described hereinabove, the magnitude and direction of FoPO $g_4$ characterize the shift between first periodic structures 376 and second periodic structures 378 when target 310 is in a state of perfect registration. In a typical case, wherein misregistration between layers 302 and 304 is not equal to zero, the actual shift between first, periodic structures 376 and second periodic structures 378 is equal to the vector sum of FoPO $g_4$ and the misregistration.

In the embodiment shown in FIGS. 3A-3G, as seen particularly in FIG. 3B, individual periodic structures of first periodic structures 362 and second periodic structures 364 fully or partially overlie each other. In another embodiment of the present invention, although the areas in which first periodic structures 362 and second periodic structures 364 are formed overlie each other, the chosen line widths of first periodic structures 362, line widths of second periodic structures 364, pitch P, pitch Q, FPO $g_1$ and SPO $g_2$ may result in individual periodic structures of first periodic structures 362 and second periodic structures 364 alternating in the x' direction with no overlap between individual periodic structures. Similarly, in another embodiment of the present invention, the chosen line widths of first periodic structures 362, line widths of second periodic structures 364, pitch P, pitch Q, FPO $g_1$ and SPO $g_2$ may result in some of individual periodic structures of first periodic structures 362 and second periodic structures 364 fully or partially overlying each other, and some of individual periodic structures of first periodic structures 362 and second periodic structures 364 alternating in the x' direction with each other.

Similarly, individual periodic structures of first periodic structures 366 and second periodic structures 368, first periodic structures 372 and second periodic structures 374, and first periodic structures 376 and second periodic structures 378 may either overlie or alternate with each other.

It is appreciated that although target 310, as in the embodiment shown in FIGS. 3A-3G and described hereinabove, includes both x' target portion 334 and y' target portion 354, in another embodiment of the present invention, target 310 may include only one of x' target portion 334 and y' target portion 354. Such a target is useful in the measurement of misregistration between layers 302 and 304 in the x' direction or y' direction, respectively.

Reference is now additionally made to FIG. 4, which is a simplified illustration of an output signal generated by a portion of target 310 when suitably illuminated. It is appreciated that FIG. 4 is illustrative in nature, and is not drawn to scale.

As seen in FIG. 4, an x' target cell 402, being one of FPPS 312 or SPPS 314, generates an output signal 410 upon suitable illumination and measurement by a scatterometry misregistration metrology tool. An example of a scatterometry misregistration metrology tool useful in the measurement of target 310 is an ATL™ 100, commercially available from KLA Corporation of Milpitas, Calif., USA.

Output signal 410 typically includes a desired signal portion 412, generated by positive first-order diffraction of incident radiation by x' target cell 402, and a desired signal portion 414, generated by negative first-order diffraction of incident radiation by x' target cell 402.

As is known in the art and described in further detail in U.S. Pat. Nos. 9,476,698, 8,330,281 and M. Adel, D. Kandel, V. Levinski, Seligson, A. Kuniaysky, "Diffraction order control in overlay metrology: a review of the roadmap options," Proc. SPIE 6922, Metrology, inspection, and Process Control for Microlithography XXII, 692202 (14 Mar. 2008), a difference between desired signal portion 412 and desired signal portion 414 is a function of misregistration in the x' direction between layers 302 and 304, and the misregistration between layers 302 and 304 in the x' direction may be calculated from output signal 410. In a preferred embodiment of the present invention, the x' direction is the same as the direction as that of semiconductor device axis 306, and the misregistration between layers 302 and 304 in the direction of semiconductor device axis 306 may be calculated from output signal 410.

Output signal 410 typically further includes a signal portion 416, generated by 0th-order diffraction of incident radiation by x' target cell 402. Associated with each of signal portions 412, 414 and 416 are a plurality of noise portions 430. Noise portions 430 include noise portions 432, which are generated by diffraction of incident radiation by edges 322 of x' target cell 302 and noise portions 434, which are generated by diffraction of incident radiation by edges 324 of x' target cell 402.

As is known in the art, as with all similar structures, edges 322 and 324 of x' target cell 402 diffract incident radiation in a direction generally perpendicular to respective edge axes 326 and 328. Thus, noise portions 432 of output signal 410 propagate generally along a noise axis generally perpendicular to edge axis 326 and noise portions 434 propagate generally along a noise axis generally perpendicular to edge axis 328. As is known in the art, as with all similar periodic structures, FPPS 312 and SPPS 314 each diffract incident radiation in a direction generally parallel to pitch axis 332. Thus, desired signal portions 412 and 414 of output signal 410 are located along an axis 442, being generally parallel to corresponding pitch axis 332.

Since pitch axis 332 is not perpendicular to either of edge axes 326 or 328, when illuminating x' target cell 402 of target 310 of the present invention with suitable incident radiation, the axes along which noise portions 430, generated by diffraction of incident radiation by edges 322 and 324, propagate are not parallel to axis 442 along which desired signal portions 412 and 414, diffracted by x' target cell 402, propagate. Thus, as seen in FIG. 4, the undesired contributions of noise portions 430 to output signal 410 of target 310 can be readily identified and removed, thereby improving the SNR of output signal 410.

In a most preferred embodiment of the present invention, in which pitch axis 332 forms a generally 45° angle with both of edge axes 326 and 328, the axes along which noise portions 430 propagate are located at, a maximum possible planar radial distance from axis 442 along which desired signal portions 412 and 414, diffracted by FPPS 312 and SPPS 314, propagate. Thus, the undesired contributions of noise portions 430 to output signal 410 can be readily identified and removed, thereby improving the SNR of output signal 410.

It is appreciated that while FIG. 4 shows output signal 410 for only a single one of FPPS 312 or SPPS 314, typically both of FPPS 312 and SPPS 314 are measured, and output signals 410 from both of FPPS 312 and SPPS 314 are analyzed in order to determine both a magnitude and a direction of misregistration in the x' direction between layers 302 and 304.

It is appreciated that upon suitable illumination and measurement of each of TPPS 316 and FoPPS 318 by a scatterometry misregistration measurement tool, an output signal, similar to output signal 410 described hereinabove with, reference to FIG. 4, is generated. Typically, the output signal generated by each of TPPS 316 and FoPPS 318 is qualitatively identical to an output signal 410 that has been rotated such that axis 442 is parallel to pitch axis 352. Thus, misregistration in the y' direction between layers 302 and 304 may be calculated from the output signals generated by TPPS 316 and FoPPS 318.

More particularly, each of the output signals generated by TPPS 316 or FoPPS 318 includes desired signal portions of the output signal similar to desired signal portions 412 and 414, which are located along an axis being generally parallel to corresponding pitch axis 352. Typically, each of the output signals generated by TPPS 316 or FoPPS 318 further include noise portions, similar to noise portions 430, which propagate in a different direction than that of axis 352.

Figure 5:
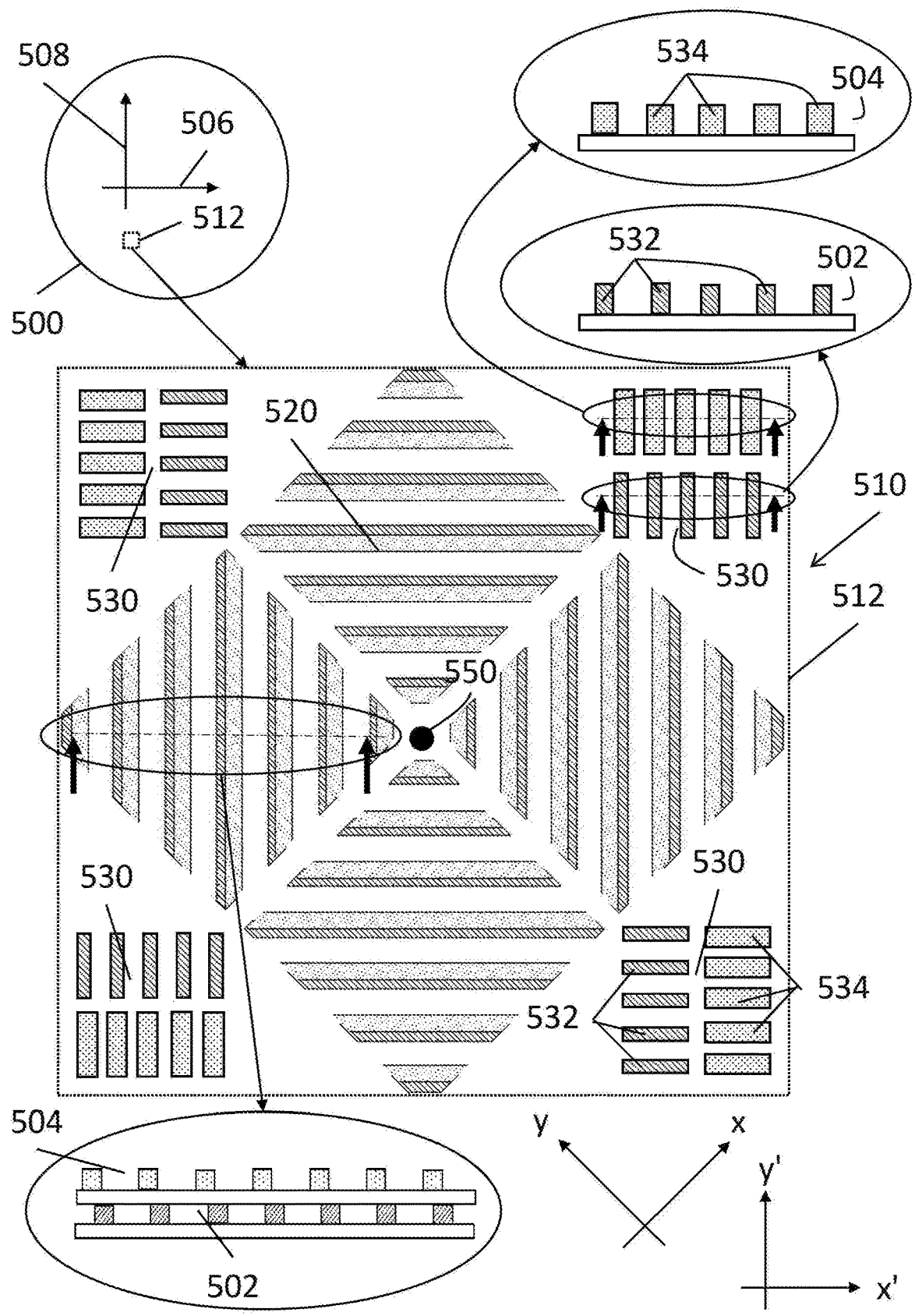
FIG. 5 is a simplified generally top planar illustration of another preferred embodiment of a target of the present invention.

Reference is now made to FIG. 5, which is a simplified generally top planar illustration of another embodiment of a target of the present invention, formed on a wafer. It is appreciated that, for ease of understanding, FIG. 5 is not drawn to scale. It is further appreciated that in a preferred embodiment of the present invention, at least some features shown may be, and typically are, covered by other structures also formed on the wafer.

As seen in FIG. 5, formed on a wafer 500 are at least a first layer 502 and a second layer 504. Preferably, first layer 502 and second layer 504 include, inter semiconductor device features (not shown), portions of which are generally parallel to either of a semiconductor device axis 506 and semiconductor device axis 508. In FIG. 5, semiconductor device axis 506 and semiconductor device axis 508 are shown as perpendicular to each other, but they need not be.

In one embodiment of the present invention, a target 510 is formed within a target-dedicated region 512 on wafer 500. Typically, the sides of target-dedicated region 512 are generally parallel to one or both of semiconductor device axes 506 and 508. In a preferred embodiment of the present invention, the size of target 510 is chosen to generally maximize the ratio of the size of target 510 to the size of target-dedicated region 512.

Target 510 preferably includes a scatterometric-sensible portion 520 and a plurality of electron beam-sensitive portions 530. Preferably, scatterometric-sensible portion 520 is identical to target 310, as described hereinabove with reference to FIGS. 3A-4.

As seen in FIG. 5, due to its rotation relative to semiconductor device axes 506 and 508, even in a case wherein scatterometric-sensible portion 520 is formed having a maximum possible area that does not extend outside of target-dedicated region 512, scatterometric-sensible portion 520 does not fill the entirety of target-dedicated region 512. In a preferred embodiment of the present invention, electron beam-sensitive portions 530 are formed particularly in those portions of target-dedicated region 512 which are not filled by scatterometric-sensible portion 520.

Electron beam sensible portions 530 either alone or together preferably include an assortment of first features 532 formed as part of layer 502 and second features 534 formed as part of layer 504, which together form an electron beam target. Such a target may be embodied as, inter alia, a target such as is shown in FIG. 5, which is similar to targets described in U.S. Pat. No. 7,608,468 entitled APPARATUS AND METHODS FOR DETERMINING OVERLAY AND USES OF SAME.

It is a particular feature of the present invention that preferably, scatterometric-sensible portion 520 and electron beam-sensible portions 530 include features formed as part of the same pairs of layers 502 and 504. Thus, scatterometric-sensible portion 520 provides an indication of misregistration between layers 502 and 504 upon imaging by a suitable scatterometry misregistration measurement tool and electron beam-sensible portion 530 provides an indication of misregistration between layers 502 and 504 upon imaging by a suitable electron beam misregistration metrology tool.

An example of a scatterometry misregistration metrology tool useful in the measurement of scatterometric-sensible portion 520 is an ATL™ 100, commercially available from KLA Corporation of Milpitas, Calif., USA. An example of an electron beam misregistration metrology tool useful in the measurement of electron beam-sensible portions 530 is an eDR7380™, commercially available from KLA Corporation of Milpitas, Calif., USA.

In a preferred embodiment of the present invention, scatterometric-sensible portion 520 and electron beam-sensible portions 530 are rotationally symmetric about a single point of symmetry 550. Thus, scatterometric-sensible portion 520 and electron beam-sensible portions 530 each provide an indication of misregistration between layers 502 and 504 at point 550.

The indication of misregistration between layers 502 and 504 provided by scatterometric-sensible portion 520 may be compared to the indication of misregistration between layers 502 and 504 provided by electron beam-sensible portions 530, and a difference between the two indications may be used to calibrate one or both of the misregistration metrology tools used to measure target 510.

It will be appreciated by persons skilled in the art that the present invention is not limited to what has been particularly shown and described hereinabove. The scope of the present invention includes both combinations and subcombinations of various features described hereinabove as well as modifications thereof, all of which are not in the prior art.

The invention claimed is:

1. A target for use in the measurement of misregistration between at least one first layer and at least one second layer formed on a wafer in the manufacture of semiconductor devices, the target comprising:
a first pair of periodic structures (FPPS) and a second pair of periodic structures (SPPS), each of said FPPS and said SPPS comprising:
a first edge axis being generally parallel to a first FPPS edge;
a second edge axis being generally parallel to a second FPPS edge;
a plurality of first periodic structures formed in a first area as part of a first FPPS layer of said at least one first layer and having a first pitch along a first pitch axis, said first pitch axis not being parallel to either of said first edge axis or second edge axis; and
a plurality of second periodic structures formed in a second area as part of a second FPPS layer of said at least one second layer and having said first pitch along a second pitch axis:
said second pitch axis being generally parallel to said first pitch axis; and
said first area and said second area at least partially overlying one another;

wherein said first pitch axis, said first edge axis and said second edge axis are arranged such that when either of said FPPS or said SPPS is illuminated by light, this results in;
a desired output signal along a signal axis, said signal axis not being perpendicular to either of said first edge axis or said second edge axis; and
a noise output signal along a first noise axis and a second noise axis, said first noise axis being generally perpendicular to said first edge axis and said second noise axis being generally perpendicular to said second edge axis, wherein overlap between said noise output signal and said desired output signal is minimized.

2. The target according to claim 1 and also comprising:
a third pair of periodic structures (TPPS) and a fourth pair of periodic structures (FoPPS), each of said TPPS and said FoPPS comprising:
a third edge axis being generally parallel to a first TPPS edge;
a fourth edge axis being generally parallel to a second TPPS edge;
a plurality of third periodic structures formed in a third area as part of a first TPPS layer of said at least one first layer and having a second pitch along a third pitch axis, said third pitch axis not being parallel to either of said third edge axis or fourth edge axis; and
a plurality of fourth periodic structures formed in a fourth area as part of a second TPPS layer of said at least one second layer and having said second pitch along a fourth pitch axis:
said fourth pitch axis being generally parallel to said third pitch axis; and
said third area and said fourth area at least partially overlying one another.

3. The target according to claim 2 and wherein:
said first FPPS layer and said first TPPS layer are the same layer; and
said second FPPS layer and said second TPPS layer are the same layer.

4. The target according to claim 2 and wherein at least one of:
said first FPPS layer and said first TPPS layer are different layers; and
said second FPPS layer and said second TPPS layer are different layers.

5. The target according to claim 2 and wherein said third pitch axis is generally perpendicular to said first pitch axis.

6. The target according to claim 1 and wherein said first pitch axis forms a 45° angle with said first edge axis.

7. The target according to claim 1 and wherein said second edge axis is generally perpendicular to said first edge axis.

8. The target according to claim 1 and wherein portions of said semiconductor devices are generally parallel to a first semiconductor device axis and said first pitch axis is generally perpendicular to said first semiconductor device axis.

9. The target according to claim 8 and also comprising electron beam sensible portions comprising:
a plurality of first features formed as part of said at least one first layer of said wafer; and
a plurality of second features formed as part of said at least one second layer of said wafer.

10. The target according to claim 9 wherein said FPPS, said SPPS and said electron beam sensible portions are all formed in a single target-dedicated region on said wafer.

11. The target according to claim 9 and wherein said target is rotationally symmetric about a single point of symmetry.

12. The target according to claim 1 and wherein portions of said semiconductor devices are generally parallel to a first semiconductor axis, and said first pitch axis is not perpendicular to said first semiconductor device axis.

13. The target according to claim 12, and wherein said target has a first size and is formed in a target-dedicated region, said target-dedicated region having a second size, and said target is oriented within said target-dedicated region such that a ratio of said first size to said second size is maximized.

14. A method of measuring misregistration between at least one first layer and at least one second layer formed on a wafer in the manufacture of semiconductor devices, the method comprising:
  providing said wafer on which is formed a target comprising:
    a first pair of periodic structures (FPPS) and a second pair of periodic structures (SPPS), each of said FPPS and said SPPS comprising:
    a first edge axis being generally parallel to a first FPPS edge;
    a second edge axis being generally parallel to a second FPPS edge;
    a plurality of first periodic structures formed in a first area as part of a first FPPS layer of said at least one first layer and having a first pitch along a first pitch axis, said first pitch axis not being parallel to either of said first edge axis or second edge axis; and
    a plurality of second periodic structures formed in a second area as part of a second FPPS layer of said at least one second layer and having said first pitch along a second pitch axis, said second pitch axis being generally parallel to said first pitch axis and said first area and said second area at least partially overlying one another;
  illuminating said target with incident radiation, thereby generating output signals, wherein each of said output signals comprises:
    a desired output signal along a signal axis, said signal axis not being perpendicular to either of said first edge axis or said second edge axis; and
    a noise output signal along a first noise axis and a second noise axis, said first noise axis being generally perpendicular to said first edge axis and said second noise axis being generally perpendicular to said second edge axis, wherein overlap between said noise output signal and said desired output signal is minimized; and
  analyzing said output signals, thereby generating a misregistration value between said layers of said target.

15. The method according to claim 14 and wherein said analyzing said output signals comprises:
  identifying and removing said noise output signals of each of said output signals.

16. The method according to claim 14 and wherein a scatterometry misregistration metrology tool generates said output signals.

17. The method according to claim 14 and wherein portions of said semiconductor devices are generally parallel to a first semiconductor device axis and said first pitch axis is generally perpendicular to said first semiconductor device axis.

18. The method according to claim 17 and wherein said target also comprises electron beam sensible portions comprising:
  a plurality of first features formed as part of said at least one first layer of said wafer; and
  a plurality of second features formed as part of said at least one second layer of said wafer.

19. The method according to claim 18 wherein said FPPS, said SPPS and said electron beam sensible portions are all formed in a single target-dedicated region on said wafer.

20. The method according to claim 18 and wherein said target is rotationally symmetric about a single point of symmetry.

21. The method according to claim 18 and also comprising measuring said electron beam sensible portions using an electron beam misregistration metrology tool.

22. The method according to claim 14 and wherein portions of said semiconductor devices are generally parallel to a first semiconductor axis, and said first pitch axis is not perpendicular to said first semiconductor device axis.

* * * * *